United States Patent
Linebarger, Jr. et al.

(10) Patent No.: US 10,872,747 B2
(45) Date of Patent: Dec. 22, 2020

(54) CONTROLLING SHOWERHEAD HEATING VIA RESISTIVE THERMAL MEASUREMENTS

(71) Applicant: Lam Research Corporation, Fremont, CA (US)

(72) Inventors: Nick Ray Linebarger, Jr., Beaverton, OR (US); Curtis W. Bailey, West Linn, OR (US); Easwar Srinivasan, Portland, OR (US); Devon Pelkey, Beaverton, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 216 days.

(21) Appl. No.: 16/058,090

(22) Filed: Aug. 8, 2018

(65) Prior Publication Data

US 2020/0051789 A1   Feb. 13, 2020

(51) Int. Cl.
*H01J 37/00* (2006.01)
*H01J 37/32* (2006.01)
(Continued)

(52) U.S. Cl.
CPC .......... *H01J 37/32449* (2013.01); *G01K 7/16* (2013.01); *G01K 15/005* (2013.01);
(Continued)

(58) Field of Classification Search
CPC ......... G02F 1/133308; G02F 1/133608; G02F 1/133603; G02F 1/133606; G02F 1/1368; G02F 2203/03; G02F 2202/28; G02F 2001/133314; G02F 1/133504; C08G 18/7671; C09J 4/00; C09J 175/04; C09J 133/06; C09J 11/08; C09J 11/04; C09J 2205/31; G09F 9/35; G09F 9/30
(Continued)

(56) References Cited

U.S. PATENT DOCUMENTS

| 5,280,422 A | 1/1994 | Moe et al. |
| 5,521,850 A | 5/1996 | Moe et al. |

(Continued)

FOREIGN PATENT DOCUMENTS

| JP | H07153550 A | 6/1995 |
| JP | H10116885 A | 5/1998 |

(Continued)

OTHER PUBLICATIONS

International Search Report and Written Opinion corresponding to PCT/US2019/030366 dated Aug. 13, 2019, 13 pages.
(Continued)

*Primary Examiner* — Rudy Zervigon (57) ABSTRACT

A showerhead for a plasma chamber comprises a resistive heater configured to receive power to heat the showerhead of the plasma chamber, and a resistive element thermally bonded to the showerhead of the plasma chamber. The resistive element changes resistance in response to a change in temperature of the showerhead. The resistive element is encapsulated in an insulating material to electrically insulate the resistive element from the showerhead. The insulating material is a good conductor of heat. The power to the resistive heater is received based on the resistance of the resistive element.

25 Claims, 7 Drawing Sheets

(51) Int. Cl.
*H01L 21/67* (2006.01)
*H05B 3/22* (2006.01)
*G01K 7/16* (2006.01)
*G01K 15/00* (2006.01)
*H01L 21/683* (2006.01)

(52) U.S. Cl.
CPC ......... *H01L 21/67248* (2013.01); *H05B 3/22* (2013.01); *H01J 37/32724* (2013.01); *H01J 2237/002* (2013.01); *H01J 2237/24585* (2013.01); *H01L 21/67017* (2013.01); *H01L 21/6833* (2013.01)

(58) Field of Classification Search
USPC ...................................... 156/345.27; 118/724
See application file for complete search history.

(56) References Cited

U.S. PATENT DOCUMENTS

| | | | |
|---|---|---|---|
| 6,627,859 B1 | 9/2003 | Kasai et al. | |
| 6,783,630 B2 * | 8/2004 | Shajii | C23C 16/463 118/724 |
| 6,951,587 B1 | 10/2005 | Narushima | |
| 7,196,295 B2 | 3/2007 | Fennewald et al. | |
| 8,552,346 B2 | 10/2013 | Ambal et al. | |
| 8,772,682 B2 | 7/2014 | Ambal et al. | |
| 9,123,755 B2 | 9/2015 | Swanson et al. | |
| 2005/0028736 A1 | 2/2005 | Long | |
| 2005/0258160 A1 | 11/2005 | Goto et al. | |
| 2006/0284722 A1 * | 12/2006 | Bernier | H01C 3/20 338/25 |
| 2007/0218200 A1 | 9/2007 | Suzuki et al. | |
| 2008/0078744 A1 * | 4/2008 | Wang | H01J 37/16 216/67 |
| 2012/0118225 A1 | 5/2012 | Hsu et al. | |
| 2013/0180963 A1 | 7/2013 | Zhang et al. | |
| 2013/0270252 A1 | 10/2013 | Ambal et al. | |
| 2014/0083361 A1 | 3/2014 | Rocha-Alvarez et al. | |
| 2015/0083042 A1 * | 3/2015 | Kobayashi | H01J 37/32082 118/500 |
| 2016/0079039 A1 | 3/2016 | Dhindsa et al. | |
| 2016/0379851 A1 | 12/2016 | Swaminathan et al. | |
| 2017/0215230 A1 | 7/2017 | Parkhe | |
| 2017/0236733 A1 | 8/2017 | Leeser | |
| 2017/0280509 A1 | 9/2017 | Takebayashi | |
| 2017/0363663 A1 | 12/2017 | Breitlow et al. | |
| 2017/0372928 A1 | 12/2017 | Yamada et al. | |
| 2018/0090306 A1 | 3/2018 | Higashijima et al. | |
| 2018/0190529 A1 | 7/2018 | Takebayashi et al. | |
| 2018/0348265 A1 | 12/2018 | Hopkins-Breitlow et al. | |

FOREIGN PATENT DOCUMENTS

| | | |
|---|---|---|
| JP | 2000235886 A | 8/2000 |
| JP | 2000339039 A | 12/2000 |
| JP | 5567318 B2 | 8/2014 |
| JP | 2017076691 A | 4/2017 |
| JP | 2017228230 A | 12/2017 |
| KR | 20-2009-0003703 U | 4/2009 |
| KR | 10-2017-0088352 A | 8/2017 |
| KR | 10-2018-0035151 A | 4/2018 |
| WO | WO-2018016384 A1 | 1/2018 |

OTHER PUBLICATIONS

International Search Report and Written Opinion corresponding to PCT/US2019/045093 dated Nov. 15, 2019, 14 pages.

U.S. Appl. No. 62/694,171, filed Jul. 5, 2018, in the names of Sairam Sundaram et al.; & entitled "Dynamic Temperature Control of Substrate Support in Substrate Processing System", pp. 1-14. (Year 2018).

International Search Report and Written Opinion corresponding to PCT/US2018/061542 dated Mar. 8, 2019, 10 pages.

International Search Report and Written Opinion corresponding to PCT/US2019/040416 dated Oct. 23, 2019, 12 pages.

International Search Report and Written Opinion corresponding to PCT/US2019/045097 dated Dec. 20, 2019, 11 pages.

U.S. Appl. No. 16/058,216, filed Aug. 8, 2018, Ramesh Chandrasekharan Oct. 7, 2020.

U.S. Appl. No. 15/972,850, filed May 7, 2018, Aaron Durbin Oct. 7, 2020.

U.S. Appl. No. 16/192,425, filed Nov. 15, 2018 Michael Roberts Oct. 7, 2020.

* cited by examiner

CONTROLLING SHOWERHEAD HEATING VIA RESISTIVE THERMAL MEASUREMENTS

FIELD

The present disclosure relates generally to semiconductor manufacturing equipment and more particularly to controlling showerhead heating via resistive thermal measurements.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit film on a substrate such as a semiconductor wafer. The substrate processing systems typically include a processing chamber and a substrate support. During film deposition, radicals and precursor gas maybe supplied to the processing chamber.

For example, the processing chamber may include an upper chamber, a lower chamber, and a substrate support. A showerhead may be arranged between the upper chamber and the lower chamber. The substrate is arranged on the substrate support in the lower chamber. A plasma gas mixture is supplied to the upper chamber and plasma is struck in the upper chamber. Some of the radicals generated by the plasma flow through the showerhead to the lower chamber. The showerhead filters ions and shields UV light from reaching the lower chamber. A precursor gas mixture is supplied to the lower chamber through the showerhead and reacts with the radicals to deposit film on the substrate.

SUMMARY

A system for measuring a temperature of a showerhead of a plasma chamber and controlling heating of the showerhead based on the temperature comprises a resistive heater to heat the showerhead of the plasma chamber and a resistive element thermally bonded to the showerhead of the plasma chamber. The resistive element includes a single metal that changes resistance in response to a change in temperature of the single metal. A controller is configured to supply power to the resistive heater to heat the showerhead, supply voltage to the resistive element, measure current through the resistive element, and determine resistance of the resistive element based on the voltage supplied to the resistive element and the current measured through the resistive element. The controller is further configured to determine the temperature of the showerhead based on the resistance of the resistive element, compare the temperature to a setpoint temperature for the showerhead, and control the supply of power to the resistive heater based on the comparison to control the heating of the showerhead.

In another feature, the controller is configured to determine the temperature of the showerhead using a lookup table generated by performing an in situ calibration of the resistive element.

In another feature, the controller is configured to increase the power supplied to the resistive heater in response to the temperature of the showerhead being less than or equal to the setpoint temperature, and decrease the power supplied to the resistive heater in response to the temperature of the showerhead being greater than or equal to the setpoint temperature.

In another feature, the resistive element is encapsulated in an insulating material to electrically insulate the resistive element from the showerhead, and the insulating material is a good conductor of heat.

In another feature, the determination of the resistance of the resistive element is immune to a DC bias associated with the showerhead.

In another feature, the DC bias is induced by plasma in the plasma chamber.

In another feature, the DC bias is applied to the showerhead to control flow of particles in the plasma chamber.

In other features, the showerhead comprises a first electrode. The system further comprises a substrate support configured to support a substrate during processing. The substrate support comprises a second electrode. The system further comprises an RF generator configured to generate RF power and a gas delivery system configured to supply process gas in the plasma chamber. The controller is further configured to apply the RF power across the first electrode and the second electrode in response to the process gas being supplied to strike plasma in the plasma chamber. The determination of the resistance of the resistive element is unaffected by a DC bias induced by the plasma on the showerhead.

In another feature, the controller is configured to apply a DC bias to the showerhead to control flow of particles in the plasma chamber, and the determination of the resistance of the resistive element is unaffected by the DC bias applied to the showerhead.

In another feature, the power supplied to the resistive heater includes AC power, and the voltage supplied to the resistive element includes DC voltage.

In other features, the system further comprises a second resistive element thermally bonded to the showerhead. The second resistive element includes the single metal. The controller is configured to supply the voltage to the second resistive element, measure current through the second resistive element, and determine resistance of the second resistive element based on the voltage supplied to the second resistive element and the current measured through the second resistive element. The controller is further configured to determine a second temperature of the showerhead based on the resistance of the second resistive element, compare the second temperature to a predetermined temperature threshold, and stop the supply of power to the resistive heater in response to the second temperature being greater than or equal to the predetermined temperature threshold to prevent the showerhead from overheating.

In other features, the system further comprises a second resistive element thermally bonded to the showerhead. The second resistive element includes the single metal. The controller is configured to supply the voltage to the second resistive element, measure current through the second resistive element, and determine resistance of the second resistive element based on the voltage supplied to the second resistive element and the current measured through the second resistive element. The controller is further configured to determine a second temperature of the showerhead based on the resistance of the second resistive element, determine an average temperature of the showerhead based on the temperature and the second temperature, compare the average temperature to the setpoint temperature, and control the supply of power to the resistive heater based on the comparison.

In other features, the system further comprises a second resistive heater arranged in a different location than a location of the resistive heater in the showerhead to heat the showerhead, and a second resistive element thermally bonded to the showerhead proximate to the different location. The second resistive element includes the single metal. The controller is configured to supply the voltage to the second resistive element, measure current through the second resistive element, and determine resistance of the second resistive element based on the voltage supplied to the second resistive element and the current measured through the second resistive element. The controller is further configured to determine a second temperature of the showerhead based on the resistance of the second resistive element, compare the second temperature to the setpoint temperature, and control the supply of power to the second resistive heater based on the comparison.

In another feature, the controller is configured to determine the temperature of the showerhead using a second lookup table generated by performing an in situ calibration of the second resistive element.

In still other features, a showerhead for a plasma chamber comprises a resistive heater configured to receive power to heat the showerhead of the plasma chamber, and a resistive element thermally bonded to the showerhead of the plasma chamber. The resistive element changes resistance in response to a change in temperature of the showerhead. The resistive element is encapsulated in an insulating material to electrically insulate the resistive element from the showerhead. The insulating material is a good conductor of heat. The power to the resistive heater is received based on the resistance of the resistive element.

In other features, a system comprises the showerhead and a controller. The controller is configured to supply the power to the resistive heater, supply a voltage to the resistive element, measure a current through the resistive element, and determine the resistance of the resistive element based on the voltage supplied to the resistive element and the current measured through the resistive element. The controller is further configured to determine the temperature of the showerhead based on the resistance of the resistive element, compare the temperature to a setpoint temperature for the showerhead, and control the supply of the power to the resistive heater based on the comparison to control the heating of the showerhead.

In another feature, the controller is configured to determine the temperature of the showerhead using a lookup table generated by performing an in situ calibration of the resistive element.

In other features, the controller is configured to increase the power supplied to the resistive heater in response to the temperature of the showerhead being less than or equal to the setpoint temperature, and decrease the power supplied to the resistive heater in response to the temperature of the showerhead being greater than or equal to the setpoint temperature.

In another feature, the determination of the resistance of the resistive element is immune to a DC bias associated with the showerhead.

In another feature, the DC bias is induced by plasma in the plasma chamber.

In another feature, the DC bias is applied to the showerhead to control flow of particles in the plasma chamber.

In other features, the showerhead comprises a first electrode. The system further comprises a substrate support configured to support a substrate during processing. The substrate support comprises a second electrode. The system further comprises an RF generator configured to generate RF power, and a gas delivery system configured to supply process gas in the plasma chamber. The controller is further configured to apply the RF power across the first electrode and the second electrode in response to the process gas being supplied to strike plasma in the plasma chamber. The determination of the resistance of the resistive element is unaffected by a DC bias induced by the plasma on the showerhead.

In other features, the controller is configured to apply a DC bias to the showerhead to control flow of particles in the plasma chamber, and the determination of the resistance of the resistive element is unaffected by the DC bias applied to the showerhead.

In another feature, the power supplied to the resistive heater includes AC power, and the voltage supplied to the resistive element includes DC voltage.

In other features, the system further comprises a second resistive element thermally bonded to the showerhead. The controller is configured to supply the voltage to the second resistive element, measure current through the second resistive element, and determine resistance of the second resistive element based on the voltage supplied to the second resistive element and the current measured through the second resistive element. The controller is further configured to determine a second temperature of the showerhead based on the resistance of the second resistive element, compare the second temperature to a predetermined temperature threshold, and stop the supply of power to the resistive heater in response to the second temperature being greater than or equal to the predetermined temperature threshold to prevent the showerhead from overheating.

In another feature, the controller is configured to determine the temperature of the showerhead using a second lookup table generated by performing an in situ calibration of the second resistive element.

In other features, the system further comprises a second resistive element thermally bonded to the showerhead. The controller is configured to supply the voltage to the second resistive element, measure current through the second resistive element, and determine resistance of the second resistive element based on the voltage supplied to the second resistive element and the current measured through the second resistive element. The controller is further configured to determine a second temperature of the showerhead based on the resistance of the second resistive element, determine an average temperature of the showerhead based on the temperature and the second temperature, compare the average temperature to the setpoint temperature, and control the supply of power to the resistive heater based on the comparison.

In other features, the system further comprises a second resistive heater arranged in a different location than a location of the resistive heater in the showerhead to heat the showerhead, and a second resistive element thermally bonded to the showerhead proximate to the different location. The controller is configured to supply the voltage to the second resistive element, measure current through the second resistive element, and determine resistance of the second resistive element based on the voltage supplied to the second resistive element and the current measured through the second resistive element. The controller is further configured to determine a second temperature of the showerhead based on the resistance of the second resistive element, compare the second temperature to the setpoint temperature, and control the supply of power to the second resistive heater based on the comparison.

In still other features, a method for controlling heating of a showerhead of a plasma chamber comprises arranging a resistive heater in the showerhead of the plasma chamber to heat the showerhead, and thermally bonding a resistive element to the showerhead of the plasma chamber. The resistive element changes resistance in response to a change in temperature of the showerhead. The resistive element is encapsulated in an insulating material to electrically insulate the resistive element from the showerhead. The insulating material is a good conductor of heat. The method further comprises measuring the resistance of the resistive element by supplying a voltage to the resistive element and measuring a current through the resistive element. The method further comprises determining the temperature of the showerhead based on the measured resistance of the resistive element. The method further comprises controlling power to the resistive heater based on the determined temperature.

In other features, the method further comprises determining the temperature of the showerhead using a lookup table generated by performing an in situ calibration of the resistive element.

In other features, the method further comprises increasing the power supplied to the resistive heater in response to the temperature of the showerhead being less than or equal to a setpoint temperature for the showerhead, and decreasing the power supplied to the resistive heater in response to the temperature of the showerhead being greater than or equal to the setpoint temperature for the showerhead.

In other features, the determination of the resistance of the resistive element is unaffected by a DC bias associated with the showerhead, and the DC bias is induced by plasma in the plasma chamber and/or is applied to the showerhead to control flow of particles in the plasma chamber.

In other features, the method further comprises bonding a second resistive element bonded to the showerhead. The second resistive element changes resistance in response to a change in temperature of the showerhead. The second resistive element is encapsulated in the insulating material. The method further comprises measuring a resistance of the second resistive element by supplying the voltage to the second resistive element and measuring a current through the second resistive element. The method further comprises determining a second temperature of the showerhead based on the measured resistance of the second resistive element. The method further comprises comparing the second temperature to a predetermined temperature threshold. The method further comprises stopping supply of the power to the resistive heater in response to the second temperature being greater than or equal to the predetermined temperature threshold to prevent the showerhead from overheating.

In other features, the method further comprises bonding a second resistive element bonded to the showerhead. The second resistive element changes resistance in response to a change in temperature of the showerhead. The second resistive element is encapsulated in the insulating material. The method further comprises measuring a resistance of the second resistive element by supplying the voltage to the second resistive element and measuring a current through the second resistive element. The method further comprises determining a second temperature of the showerhead based on the measured resistance of the second resistive element. The method further comprises determining an average temperature of the showerhead based on the temperature and the second temperature. The method further comprises comparing the average temperature to a setpoint temperature for the showerhead. The method further comprises controlling the power to the resistive heater based on the comparison.

In other features, the method further comprises determining the temperature of the showerhead using a second lookup table generated by performing an in situ calibration of the second resistive element.

In other features, the method further comprises arranging a second resistive heater in a different location than a location of the resistive heater in the showerhead to heat the showerhead, and thermally bonding a second resistive element to the showerhead proximate to the different location. The method further comprises supplying the voltage to the second resistive element, measuring current through the second resistive element, and determining resistance of the second resistive element based on the voltage supplied to the second resistive element and the current measured through the second resistive element. The method further comprises determining a second temperature of the showerhead based on the resistance of the second resistive element, comparing the second temperature to the setpoint temperature, and controlling the supply of power to the second resistive heater based on the comparison.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Generally, a showerhead does not have a thermal control system. However, in some processing systems, a basic thermal control system is used to control a temperature of the showerhead, which is heated using a resistive heater.

When a resistive heater element is used to heat the showerhead, one or more thermocouples are typically embedded in the showerhead to measure the temperature of the showerhead and to control the heating of the showerhead based on the measured temperature.

A problem with the thermocouple based control system is that any DC or AC power (low or high frequency, currently 13.56 kHz, 400 Hz, and 120 Hz) that is introduced into the system (e.g., AC power supplied to the resistive heater and/or DC bias that is applied or plasma-induced in the showerhead) can affect the control system. The principal issue is that DC from any of these sources gets added to the low voltage thermocouple signal as DC noise, and it is very difficult to differentiate the low voltage thermocouple signal from the DC noise. Consequently, the control system receives a false reading from the thermocouple, which can render the control system inaccurate or inoperable. While it is possible to filter the DC, filtering requires additional circuitry.

Instead, the present disclosure proposes systems and methods for measuring the temperature of the showerhead and controlling the showerhead heating using resistive thermal measurements. The systems and methods according to the present disclosure can measure the showerhead temperature and control the showerhead heating by measuring resistance of a resistive element that changes resistance with temperature.

Specifically, to measure the showerhead temperature for controlling the showerhead heating, a DC voltage is applied across the resistive element, and current through the resistive element is measured. Based on the measured current and the voltage applied to the resistive element, the resistance of the resistive element can be determined. In some instances, since the DC voltage output by a power supply may vary and since the resistance of the resistive element needs to be detected and measured accurately, the DC voltage output by the power supply can also be measured and used along with the measured current to determine of the resistance of the resistive element.

The measured resistance of the resistive element can be used to infer (i.e., correlated to or translated into) the temperature of the showerhead by referencing a lookup table, which can be empirically generated a priori by performing a calibration procedure described below in detail. Alternatively, since a temperature/resistance relationship of the resistive element is generally a linear relationship and can be described by a formula, the formula may be used to determine the temperature of the showerhead. The control system can then compare the measured temperature of the showerhead to a desired setpoint temperature for the showerhead. Based on the comparison, the control system can increase or decrease the power supplied to the resistive heater to maintain the showerhead temperature at or near the desired setpoint temperature for the showerhead.

Since a known or measured DC voltage is applied across the resistive element and the current through the resistive element is measured, any stray or additional DC or AC that gets added as described above can be accounted for in the resistance calculations. Accordingly, the resistive element based measurement proposed by the present disclosure decouples the control system from noise introduced by power inputs or other sources in the processing chambers.

Figure 3:
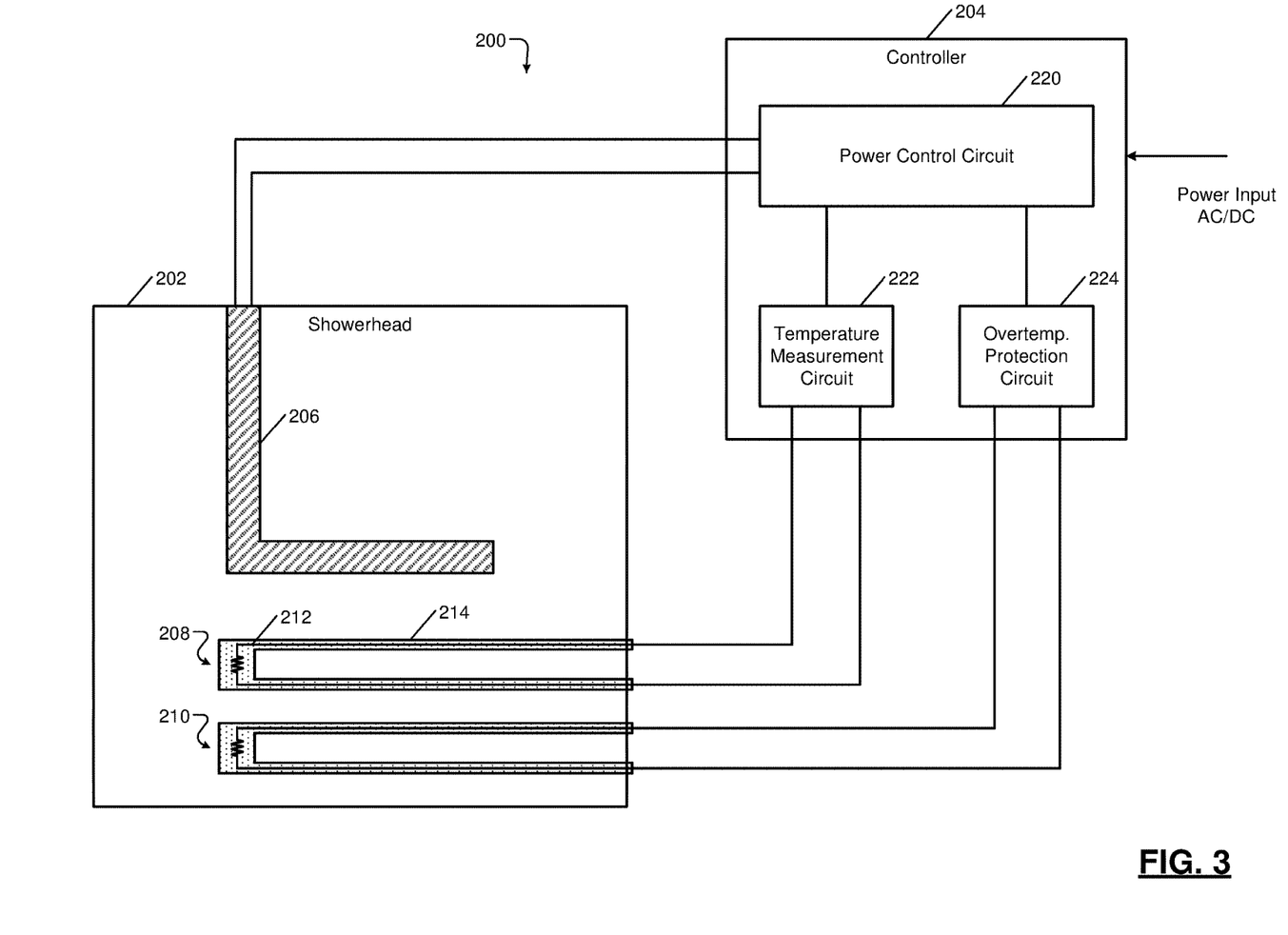
FIG. 3 is a functional block diagram of an example of a control system comprising a resistive element for measuring a temperature of a showerhead and for controlling heating of the showerhead based on the measured temperature according to the present disclosure.
Figure 4:
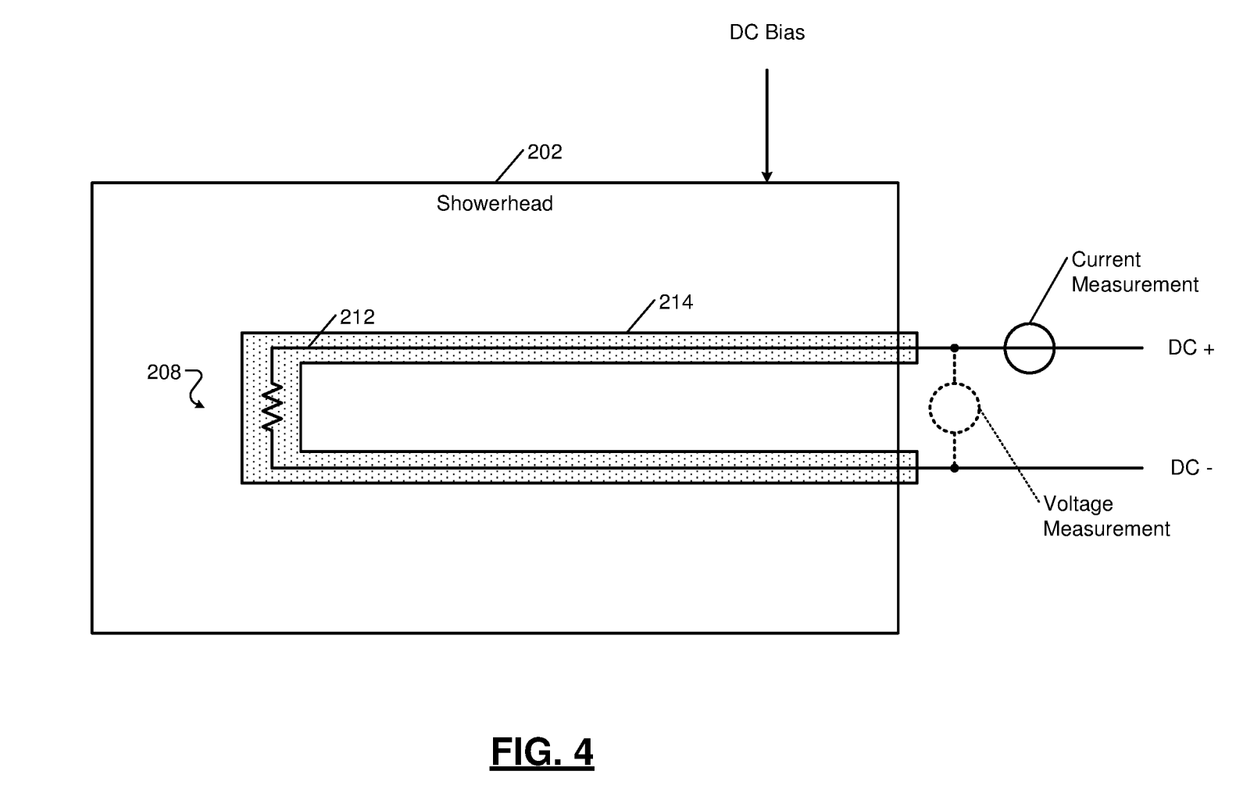
FIG. 4 shows the resistive element of the control system of FIG. 3 in detail and schematically shows the resistive element embedded in a metal block of the showerhead of FIG. 3 according to the present disclosure.

In the resistive element based control system according to the present disclosure, the resistive element is closely linked (bonded) to the thermal mass of the showerhead to provide the response needed for accurate control (see FIGS. 3 and 4). Unlike the thermocouple based control system that is susceptible to DC noise as described above, the resistive element based control system is not sensitive to DC noise for the reasons mentioned above. Accordingly, unlike the thermocouple based control system, the resistive element based control system provides accurate control of showerhead heating.

Further, the control system of the present disclosure may or may not need an over temperature control or an auxiliary temperature measurement device. However, if such a device is used, the device can be implemented using another resistive element similar to that used to control showerhead heating. Alternatively, a snap switch (i.e., a normally closed switch) may be used, which opens and disconnects power to the resistive heater when the showerhead overheats and the showerhead temperature exceeds a predetermined limit. As another alternative, a thermocouple or any other suitable device may be used as an over temperature control or an auxiliary temperature measurement device.

The resistive element used to control showerhead heating according to the present disclosure provides additional advantages. For example, the resistive element can control the temperature of the showerhead through all cycles of the showerhead's use. Specifically, the resistive element can measure the temperature of the showerhead while the power supply to the resistive heater is turned off. That is, the resistive element can measure the temperature of the showerhead not only when the showerhead is in an on state but also when the showerhead is in an off state. In other words, the power supply to the resistive heater need not be turned on in order to measure the temperature of the showerhead using the resistive element.

In contrast, when a thermocouple is used to measure and control the temperature of the showerhead, the thermocouple based control system can measure the temperature of the showerhead only when the showerhead is in an on state. The thermocouple based control system cannot measure the temperature of the showerhead when the showerhead is in an off state (i.e., when the showerhead heater is powered off). Accordingly, using the resistive element instead of the thermocouple is advantageous for this additional reason in addition to the resistive element being immune to DC noise and providing more accurate temperature measurement and heating control for the showerhead than the thermocouple.

The present disclosure is organized as follows. Examples of processing chambers used for processing substrates are described with reference to FIGS. 1 and 2. An example of a control system according to the present disclosure comprising a resistive element for measuring a temperature of a showerhead and controlling heating of the showerhead based on the measured temperature is described with reference to FIG. 3. An example of the resistive element embedded in the showerhead according to the present disclosure is shown in detail in FIG. 4. An example of a temperature measurement circuit used in the control system of the present disclosure to measure the showerhead temperature to control the showerhead heating is described with reference to FIG. 5. Examples of achieving temperature uniformity across the showerhead by dividing the showerhead in a plurality of zones and using a separate resistive heater and a separate resistive element for each zone are described with reference to FIGS. 6A and 6B. An example of a method according to the present disclosure for using a resistive element for measuring a temperature of a showerhead and for controlling heating of the showerhead based on the measured temperature is described with reference to FIG. 7.

Figure 1:
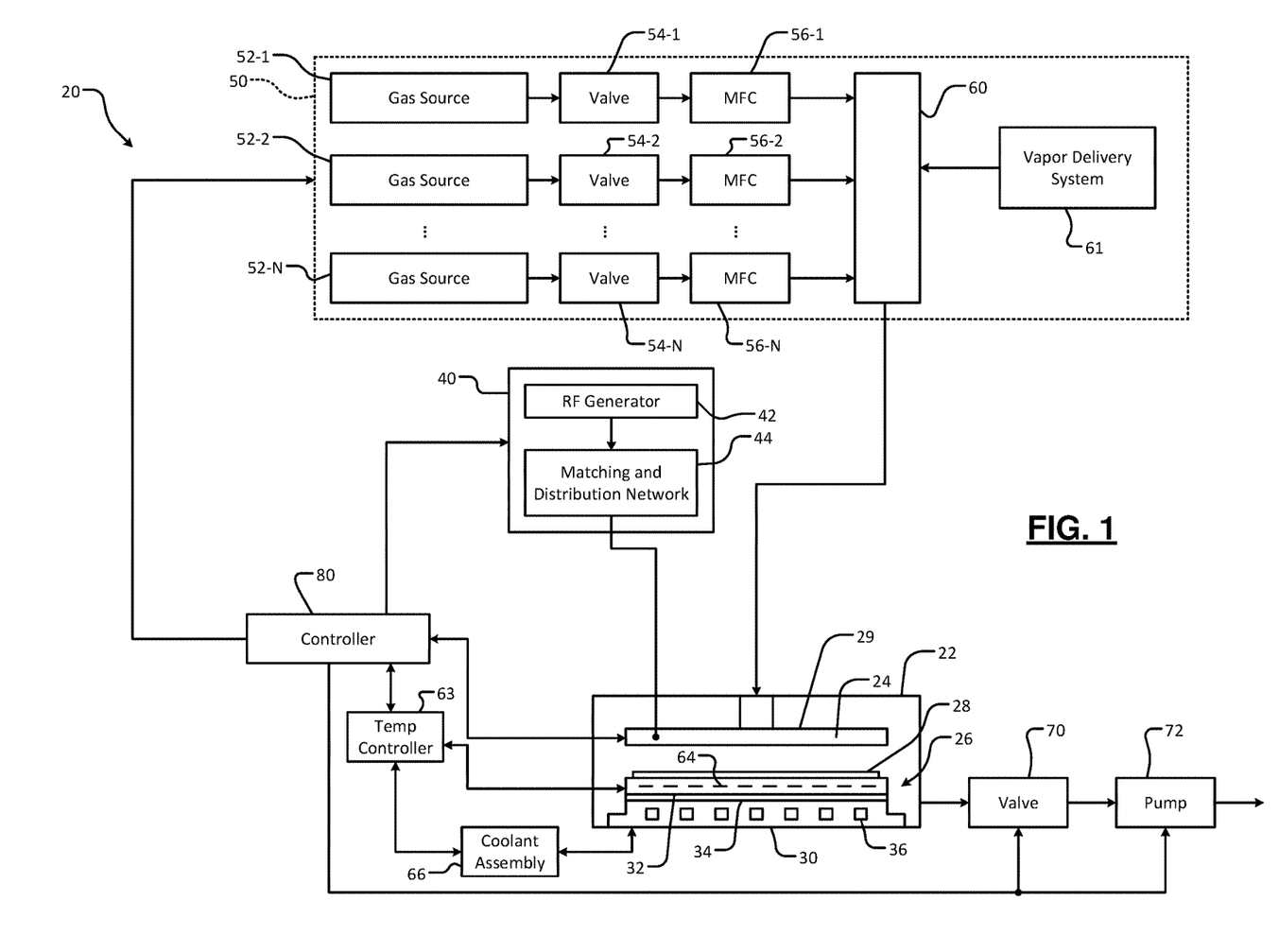
FIG. 1 is a functional block diagram of one example of a processing chamber of a substrate processing system.

FIG. 1 shows a substrate processing system 20 comprising a processing chamber 22. While the foregoing example will be described in the context of plasma enhanced chemical vapor deposition (PECVD), the teachings of the present disclosure may be applied to other substrate processing systems such as atomic layer deposition (ALD), PEALD, CVD, or other process. The system 20 includes a processing chamber 22 that encloses other components of the system 20 and contains RF plasma (if used). The system 20 includes an upper electrode 24 and an electrostatic chuck (ESC) 26 or other substrate support. During operation, a substrate 28 is arranged on the ESC 26.

For example, the upper electrode 24 may include a gas distribution device 29 such as a showerhead that introduces and distributes process gases. The gas distribution device 29 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which vaporized precursor, process gas, or purge gas flows. Alternately, the upper electrode 24 may include a conducting plate, and the process gases may be introduced in another manner.

The ESC 26 includes a baseplate 30 that acts as a lower electrode. The baseplate 30 supports a heating plate 32, which may correspond to a ceramic multi-zone heating plate. A thermal resistance layer 34 may be arranged between the heating plate 32 and the baseplate 30. The baseplate 30 may include one or more channels 36 for flowing coolant through the baseplate 30.

If plasma is used, an RF generating system 40 generates and outputs an RF voltage to one of the upper electrode 24 and the lower electrode (e.g., the baseplate 30 of the ESC 26). The other one of the upper electrode 24 and the baseplate 30 may be DC grounded, AC grounded, or floating. For example only, the RF generating system 40 may include an RF generator 42 that generates RF power that is fed by a matching and distribution network 44 to the upper electrode 24 or the baseplate 30. In other examples, the plasma may be generated inductively or remotely.

A gas delivery system 50 includes one or more gas sources 52-1, 52-2, . . . , and 52-N (collectively gas sources 52), where N is an integer greater than zero. The gas sources 52 are connected by valves 54-1, 54-2, . . . , and 54-N (collectively valves 54) and mass flow controllers 56-1, 56-2, . . . , and 56-N (collectively mass flow controllers 56) to a manifold 60. A vapor delivery system 61 supplies vaporized precursor to the manifold 60 or another manifold (not shown) that is connected to the processing chamber 22. An output of the manifold 60 is fed to the processing chamber 22.

A temperature controller 63 may be connected to a plurality of thermal control elements (TCEs) 64 arranged in the heating plate 32. The temperature controller 63 may be used to control the plurality of TCEs 64 to control a temperature of the ESC 26 and the substrate 28. The temperature controller 63 may communicate with a coolant assembly 66 to control coolant flow through the channels 36. For example, the coolant assembly 66 may include a coolant pump, a reservoir, and one or more temperature sensors. The temperature controller 63 operates the coolant assembly 66 to selectively flow the coolant through the channels 36 to cool the ESC 26.

A valve 70 and pump 72 may be used to evacuate reactants from the processing chamber 22. A system controller 80 may be used to control components of the system 20. In some examples, the showerhead may be heated using a resistive heater (see an example shown in FIG. 3). The controller 80 may be connected to one or more temperature sensors arranged in the showerhead such as those described below with reference to FIGS. 3-6B to measure the temperature of the showerhead and to control the heating of the showerhead based on the temperature measured using the sensors. The controller 80 may control the supply of AC and DC power respectively to the resistive heater and the sensors as described below in detail with reference to FIGS. 3-6B.

Figure 2:
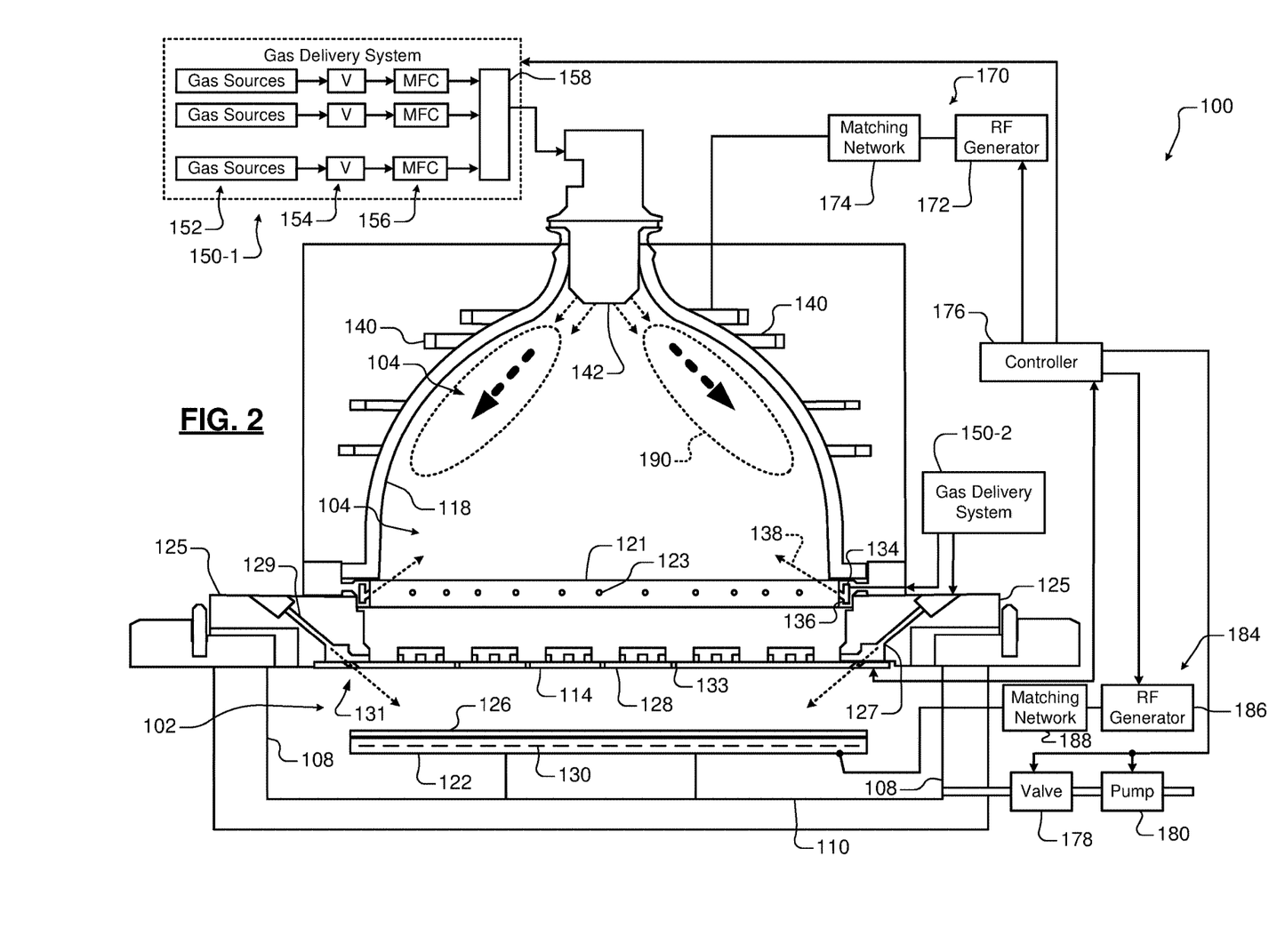
FIG. 2 is a functional block diagram of another example of a processing chamber of a substrate processing system.

FIG. 2 shows an example of a processing chamber 100 for etching a layer of a substrate. While a specific chamber is shown and described, the teachings of the present disclosure may be applied to other substrate processing apparatuses. The processing chamber 100 includes a lower chamber region 102 and an upper chamber region 104. The lower chamber region 102 is defined by chamber sidewall surfaces 108, a chamber bottom surface 110, and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter, and the holes 131 are not needed. In some examples, the process gas is delivered by the one or more spaced holes 127 in a downward direction towards a substrate 126 at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 104. In some examples, the substrate support 122 includes an electrostatic chuck (ESC), although other types of substrate supports can be used. The substrate 126 is arranged on an upper surface of the substrate support 122 during etching. In some examples, a temperature of the substrate 126 may be controlled by a heater plate 130, an optional cooling plate with fluid channels, and one or more sensors (not shown), although any other suitable substrate support temperature control system may be used.

In some examples, the gas distribution device 114 includes a showerhead (for example, a plate 128 having a plurality of spaced holes 133). The plurality of spaced holes 133 extend from the upper surface of the plate 128 to the lower surface of the plate 128. In some examples, the spaced holes 133 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, the gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123), and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

In some examples, the showerhead may be heated using a resistive heater (see an example shown in FIG. 3). The controller 176 may be connected to one or more temperature sensors arranged in the showerhead such as those described below with reference to FIGS. 3-6B to measure the temperature of the showerhead and to control the heating of the showerhead based on the temperature measured using the sensors. The controller 176 may control the supply of AC and DC power respectively to the resistive heater and the sensors as described below in detail with reference to FIGS. 3-6B.

FIG. 3 shows a control system 200 according to the present disclosure that uses a resistive element for measuring temperature of a showerhead and for controlling the heating of the showerhead based on the measured temperature. The control system 200 comprises a showerhead 202 and a controller 204. The showerhead 202 may be similar to the showerheads 29, 114 shown in FIGS. 1 and 2. The controller 204 may be similar to the controllers 80, 176 shown in FIGS. 1 and 2.

The showerhead 202 may be made from a block of metal such as aluminum or an alloy thereof. A resistive heater 206 is embedded in the showerhead 202. Additionally, one or more resistive elements 208, 210 are embedded in the showerhead 202. The resistive element 208 is used to measure the temperature of the showerhead 202 as described below. While only one resistive element 208 is shown, a plurality of resistive elements 208 may be deployed throughout the metal block of the showerhead 202, and the temperature measurements provided by the plurality of resistive elements 208 may be averaged to improve accuracy of the control system 200. The resistive element 210 is optionally used for over-temperature protection as described below. Alternatively, other protective elements such as a snap switch (described above), a thermocouple, or other suitable devices may be used instead.

The resistive element 208 comprises a wire 212 of a single metal or element such as tungsten, platinum, or molybdenum. The material used for the wire 212 has a high temperature coefficient of resistance (TCR) and changes resistance measurably when the temperature of the showerhead 202 changes slightly. The slope of the temperature/resistance curve for the material used for the wire 212 is such that minute changes in the temperature of the showerhead 202 can be detected by measuring the resistance of the wire 212. The wire 212 is surrounded by an insulator 214. The insulator 214 is a bad conductor of electricity and a good conductor of heat. For example, a dielectric material (e.g., MgO) having a high thermal conductivity (compatible with a thermal conductivity of the metal used to form the wire 212) may be used as the insulator 214. Accordingly, the resistive element 208 is electrically insulated from the showerhead 202 but is highly thermally conductive. The resistive element 208 is thermally connected to the metal block of the showerhead 202 such that the resistive element 208 is in close thermal contact with the metal block of the showerhead 202. Non-limiting examples of processes and materials used to thermally connect the resistive element 208 to the metal block include using thermally conductive epoxy bonding material, or bonding a protective sheath that surrounds the resistive element 208 to the metal block via welding, brazing, swaging, or using interface fit, etc.

The manufacturers of the wire 212, the insulator 214, and/or the resistive element 208 as a whole may provide a lookup table that indicates the temperature/resistance relationship for the wire 212, the insulator 214, and/or the resistive element 208 as a whole. However, the lookup table provided by the manufacture does not take into account the surroundings in which the resistive element 208 operates—the showerhead 202. For example, the insulator 214 that surrounds the wire 212 can affect the rate of heat transfer from the showerhead 202 to the wire 212. To account for such effects, an in situ calibration procedure is performed with the resistive element 208 installed in the showerhead 202. A specific look up table indicating the actual temperature/resistance relationship of the resistive element 208, with the resistive element 208 installed in the showerhead 202, is generated using the calibration procedure. It is this specific lookup table, and not the manufacturer's lookup table for the wire 212, the insulator 214, and/or the resistive element 208 as a whole, is used to infer or determine the temperature of the showerhead 202 when the resistance of the resistive element 208 is determined as described above. Further, if multiple resistive elements 208 are disposed in different zones within the showerhead 202 (see FIGS. 6A and 6B and corresponding description below), the resistive element 208 in each zone is separately calibrated in situ. Further, for accurate thermal control of the showerhead 202, the materials used for the wire 212 and the insulator 214 are selected such that their thermal and resistive properties remain stable over time.

The resistive element 208 is not a thermocouple. Specifically, unlike a thermocouple, which is made of two metals, the wire 212 of the resistive element 208 is made of a single metal. Further, unlike a thermocouple that senses a temperature difference between its two elements and generates a voltage signal, the resistive element 208 responds to temperature changes in its surroundings by changing its resistance. Thus, the resistive element 208 is a single element structure that senses temperature in terms of its resistance and not a two-element structure like a thermocouple that senses temperature and outputs a voltage signal.

FIG. 4 shows the construction of the resistive element 208 more clearly. When used, the resistive element 210 is constructed and installed similarly to the resistive element 208. In the resistive elements 208, 210, a resistor is shown to represent a resistance of the wire 212 and is shown for illustrative purposes only. The resistor shown merely indicates that the wire 212 has a resistance. The resistive elements 208, 210 do not include a resistance in addition to the wire 212.

Further, the resistive elements 208, 210 are shown as two terminal devices (i.e., each having two terminal or leads). However, while not shown, the resistive elements 208, 210 can include 3 or 4 terminals each and are within the scope of the present disclosure. The circuitry associated with the resistive elements 208, 210 (e.g., temperature measurement circuit 222 and over-temperature protection circuit 224 shown and described below) can be adapted depending on the number of leads each has.

FIG. 4 also shows presence of a DC bias on the showerhead 202. The DC bias may include a plasma induced DC potential (called self-bias) on the showerhead 202 relative to the substrate support. Alternatively or additionally, the DC bias may include bias supplied to the showerhead 202 to control flow of radicals relative to (e.g., away from) the substrate. It is this DC bias that renders the thermocouple based control inaccurate. In contrast, the control based on the resistive element 208 is immune to (i.e., unaffected by) the DC bias due to the manner in which the showerhead temperature is measured using the resistive element 208 (specifically, applying DC voltage to the resistive element 208, measuring current through (and voltage across) the resistive element 208, determining the resistance of the resistive element 208, and correlating the resistance to infer the temperature of the showerhead 202).

In FIG. 3, the controller 204 comprises a power control circuit 220, a temperature measurement circuit 222, and an over-temperature protection circuit 224. The controller 204 receives AC and DC power that is respectively supplied to the resistive heater 206 and the resistive elements 208, 210. The power control circuit 220 supplies the AC power to the resistive heater 206 under the control of the temperature measurement circuit 222 and the over-temperature protection circuit 224 as described below.

The temperature measurement circuit 222 supplies a DC voltage to the resistive element 208. The temperature measurement circuit 222 may also measure the DC voltage supplied to the resistive element 208. The temperature measurement circuit 222 measures the current through the resistive element 208, which changes as the resistance of the resistive element 208 changes based on changes in the temperature of the showerhead 202. FIG. 4 schematically shows the application of the DC voltage to the resistive element 208 and the measurement of the current through (and voltage across) the resistive element 208.

The temperature measurement circuit 222 determines the resistance of the resistive element 208 based on the measured the current through the resistive element 208 and the DC voltage applied to the resistive element 208. The temperature measurement circuit 222 correlates the measured resistance to the temperature of the showerhead 202 using a lookup table generated a priori or using a formula representing a temperature/resistance relationship of the resistive element 208.

The temperature measurement circuit 222 compares the measured temperature of the showerhead 202 to a setpoint temperature for the showerhead 202. The temperature measurement circuit 222 outputs an indication to the power control circuit 220 as to whether the measured temperature of the showerhead 202 is greater or less than the setpoint temperature for the showerhead 202. The power control circuit 220 decreases or increases the AC power supplied to the resistive heater 206 depending on whether the measured temperature of the showerhead 202 is greater or less than the setpoint temperature.

When a plurality of resistive elements 208 are used to measure the showerhead temperature, an additional averaging circuit (not shown) can be used to average the temperature measurements from each of the plurality of resistive elements 208. Further, the indication that is output to the power control circuit 220 is based on a comparison of the average of the temperature measurements and the setpoint temperature for the showerhead 202.

The over-temperature protection circuit 224 also measures the temperature of the showerhead 202 using the resistive element 210 in the same manner as that described with reference to the temperature measurement circuit 222. The over-temperature protection circuit 224 compares the measured temperature of the showerhead 202 to a predetermined threshold temperature. For example, the predetermined threshold temperature is greater than or equal to an upper bound of a temperature range in which the showerhead temperature is controlled. The over-temperature protection circuit 224 outputs an indication to the power control circuit 220 as to whether the measured temperature of the showerhead 202 is greater or less than the predetermined threshold temperature. The power control circuit 220 disconnects or stops supplying the AC power to the resistive heater 206 when the measured temperature of the showerhead 202 is greater than or equal to the predetermined threshold temperature.

Figure 5:
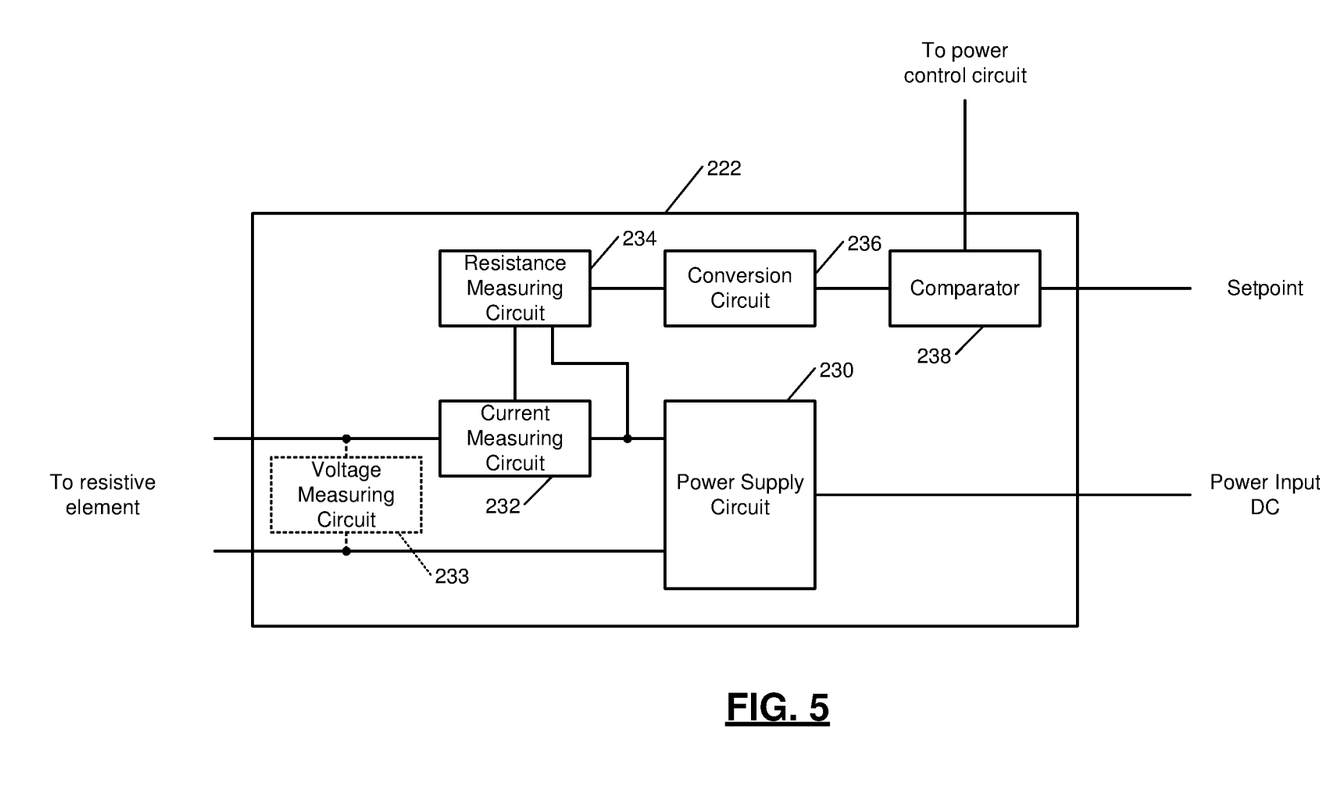
FIG. 5 is a functional block diagram of an example of a temperature measurement circuit of the control system of FIG. 3 that measures the showerhead temperature to control the showerhead heating according to the present disclosure.

FIG. 5 shows an example of the temperature measurement circuit 222. For example, the temperature measurement circuit 222 may include a DC power supply 230, a current measuring circuit 232, a voltage measuring circuit 233 (optional), a resistance measuring circuit 234, a conversion circuit 236, and a comparator 238. The DC power supply 230 supplies a DC voltage across the resistive element 208. The current measuring circuit 232 measures the current through the resistive element 208. The voltage measuring circuit 233 measures the DC voltage applied across the resistive element 208 by the DC power supply 230. The resistance measuring circuit 234 measures the resistance of the resistive element 208 based on the measured current through the resistive element 208 and the known or measured DC voltage supplied to the resistive element 208.

The resistance measuring circuit 234 outputs the resistance measurement to the conversion circuit 236. The conversion circuit 236 utilizes a lookup table or a formula representing the temperature/resistance relationship of the resistive element 208 to convert the resistance measurement to a temperature measurement and outputs the temperature measurement corresponding to the resistance measurement. In other words, the output of the conversion circuit 236 indicates the current temperature of the showerhead 202 based on the resistance measurement performed by the resistance measuring circuit 234.

The comparator 238 compares the temperature measurement output by the conversion circuit 236 to the setpoint temperature of the showerhead 202. The comparator 238 outputs the indication to the power control circuit 220 as to whether the temperature of the showerhead 202 is greater or less than the setpoint temperature.

The power control circuit 220 decreases or increases the AC power supplied to the resistive heater 206 depending on whether the measured temperature of the showerhead 202 is greater or less than the setpoint temperature. The power control circuit 220 decreases or increases the AC power supplied to the resistive heater 206 based on the measured temperature of the showerhead 202. For example, the power control circuit 220 may increase or decrease the amount of AC power supplied to the resistive heater 206 depending on whether the measured temperature of the showerhead 202 is less or greater than the setpoint temperature. Alternatively, the power control circuit 220 may increase or decrease the duration for which the AC power is supplied to the resistive heater 206 depending on whether the measured temperature of the showerhead 202 is less or greater than the setpoint temperature.

The over-temperature protection circuit 224 may have similar structure as the temperature measurement circuit 222 except that the comparator in the over-temperature protection circuit 224 may compare the measured temperature of the showerhead 202 to a predetermined threshold temperature that is much greater than the setpoint temperature (e.g., greater than or equal to an upper bound of a temperature range in which the showerhead temperature is controlled). Further, the power control circuit 220 shuts of the AC power supply to the resistive heater 206 rather than increasing or decreasing the AC power supply to the resistive heater 206 when the comparator in the over-temperature protection circuit 224 outputs an indication that the temperature of the showerhead 202 is greater than or equal to the predetermined threshold temperature.

Figure 6A:
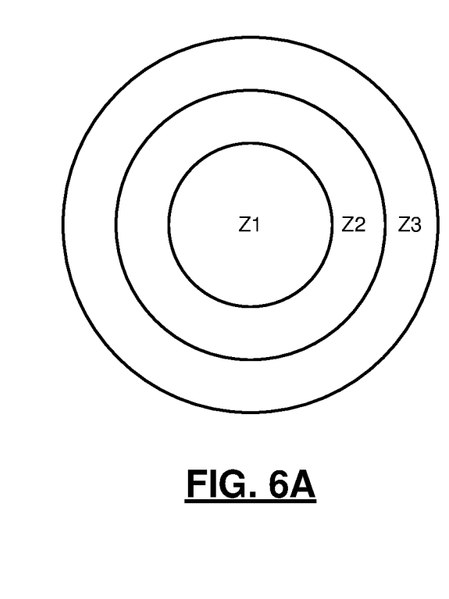
FIGS. 6A and 6B show examples of achieving temperature uniformity across the showerhead by dividing the showerhead in a plurality of zones and using a separate resistive heater and a separate resistive element for each zone.
Figure 6B:
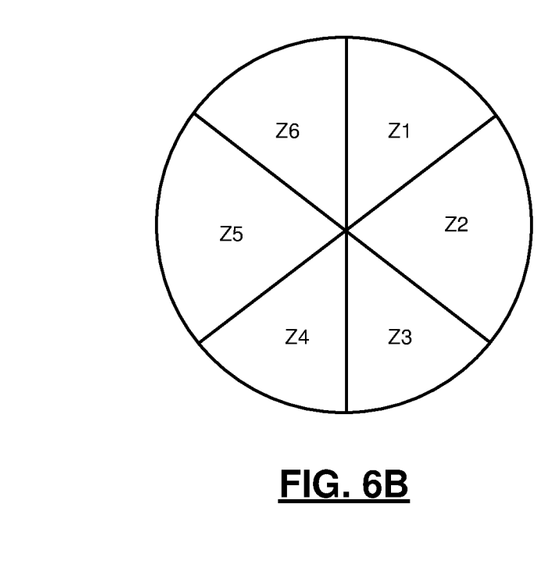

Referring now to FIGS. 6A and 6B, in some implementations, the showerhead 202 may be divided into a plurality of zones. A separate resistive heater such as the resistive heater 206 and a separate resistive element such as the resistive element 208 may be disposed in each zone. For example only, the zones may include concentric zones Z1, Z2, and Z3 as shown in FIG. 6A or radial zones Z1-Z6 as shown in FIG. 6B. Fewer or additional zones than those shown may be used. Alternatively, other types of zoning configurations than those shown may be also used. The resistive heater in a zone $Z_i$ is controlled based on the temperature of the zone $Z_i$ measured by the resistive element in the zone $Z_i$. The temperature of the showerhead 202 can be maintained nearly uniformly across the showerhead 202.

Figure 7:
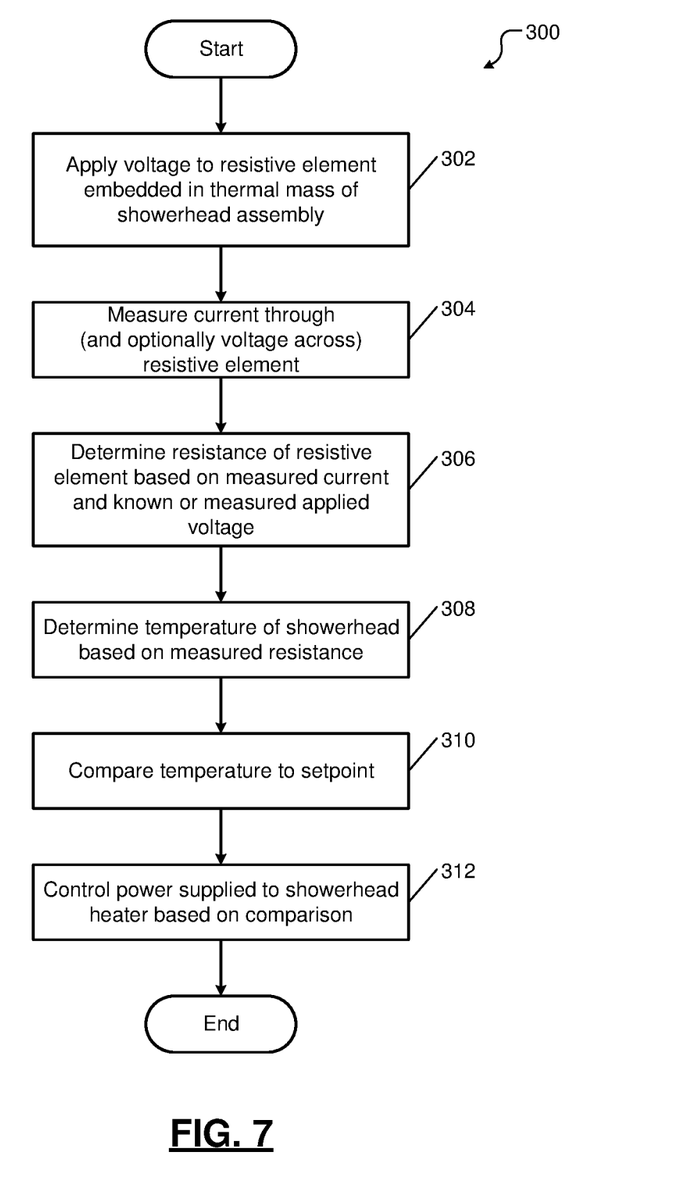
FIG. 7 is a flowchart of an example of a method for using a resistive element for measuring a temperature of a showerhead and for controlling heating of the showerhead based on the measured temperature according to the present disclosure.

FIG. 7 shows a method 300 for measuring the temperature of the showerhead and controlling the heating of the showerhead based on the measured temperature using a resistive element according to the present disclosure. At 302, the method applies a DC voltage to a resistive element embedded in the thermal mass of the showerhead assembly. At 304, the method measures current through (and optionally voltage across) the resistive element. At 306, the method measures the resistance of the resistive element based on the measured current and the known or measured applied voltage. At 308, the method determines the temperature of the showerhead based on the measured resistance. At 310, the method compares the temperature of the showerhead to a setpoint temperature of the showerhead. At 312, the method controls the power supply to the showerhead heater based on the comparison as described above. In some implementations, the method also shuts of power to the showerhead heater when the temperature of the showerhead is greater than or equal to a predetermined threshold temperature as described above.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a semiconductor wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for measuring a temperature of a showerhead of a plasma chamber and controlling heating of the showerhead based on the temperature, the system comprising:
    a resistive heater to heat the showerhead of the plasma chamber;
    a resistive element thermally bonded to the showerhead of the plasma chamber, wherein the resistive element includes a single metal that changes resistance in response to a change in temperature of the single metal; and
    a controller configured to:
        supply power to the resistive heater to heat the showerhead;
        supply voltage to the resistive element;
        measure current through the resistive element;
        determine resistance of the resistive element based on the voltage supplied to the resistive element and the current measured through the resistive element;
        determine the temperature of the showerhead based on the resistance of the resistive element;
        compare the temperature to a setpoint temperature for the showerhead; and
        control the supply of power to the resistive heater based on the comparison to control the heating of the showerhead,
        wherein the power supplied to the resistive heater includes AC power and wherein the voltage supplied to the resistive element includes DC voltage.

2. The system of claim 1 wherein the controller is configured to determine the temperature of the showerhead using a lookup table generated by performing an in situ calibration of the resistive element.

3. The system of claim 1 wherein the controller is configured to:
increase the power supplied to the resistive heater in response to the temperature of the showerhead being less than or equal to the setpoint temperature; and
decrease the power supplied to the resistive heater in response to the temperature of the showerhead being greater than or equal to the setpoint temperature.

4. The system of claim 1 wherein the resistive element is encapsulated in an insulating material to electrically insulate the resistive element from the showerhead and wherein the insulating material is a good conductor of heat.

5. The system of claim 1 wherein the determination of the resistance of the resistive element is immune to a DC bias associated with the showerhead.

6. The system of claim 5 wherein the DC bias is induced by plasma in the plasma chamber.

7. The system of claim 5 wherein the DC bias is applied to the showerhead to control flow of particles in the plasma chamber.

8. The system of claim 1 wherein the showerhead comprises a first electrode, the system further comprising:
a substrate support configured to support a substrate during processing, the substrate support comprising a second electrode;
an RF generator configured to generate RF power; and
a gas delivery system configured to supply process gas in the plasma chamber,
wherein the controller is further configured to apply the RF power across the first electrode and the second electrode in response to the process gas being supplied to strike plasma in the plasma chamber, and
wherein the determination of the resistance of the resistive element is unaffected by a DC bias induced by the plasma on the showerhead.

9. The system of claim 8 wherein:
the controller is configured to apply a DC bias to the showerhead to control flow of particles in the plasma chamber; and
the determination of the resistance of the resistive element is unaffected by the DC bias applied to the showerhead.

10. The system of claim 1 further comprising:
a second resistive element thermally bonded to the showerhead, wherein the second resistive element includes the single metal; and
wherein the controller is configured to:
supply the voltage to the second resistive element;
measure current through the second resistive element;
determine resistance of the second resistive element based on the voltage supplied to the second resistive element and the current measured through the second resistive element;
determine a second temperature of the showerhead based on the resistance of the second resistive element;
compare the second temperature to a predetermined temperature threshold; and
stop the supply of power to the resistive heater in response to the second temperature being greater than or equal to the predetermined temperature threshold to prevent the showerhead from overheating.

11. The system of claim 1 further comprising:
a second resistive element thermally bonded to the showerhead, wherein the second resistive element includes the single metal; and
wherein the controller is configured to:
supply the voltage to the second resistive element;
measure current through the second resistive element;
determine resistance of the second resistive element based on the voltage supplied to the second resistive element and the current measured through the second resistive element;
determine a second temperature of the showerhead based on the resistance of the second resistive element;
determine an average temperature of the showerhead based on the temperature and the second temperature;
compare the average temperature to the setpoint temperature; and
control the supply of power to the resistive heater based on the comparison.

12. The system of claim 1 further comprising:
a second resistive heater arranged in a different location than a location of the resistive heater in the showerhead to heat the showerhead;
a second resistive element thermally bonded to the showerhead proximate to the different location, wherein the second resistive element includes the single metal; and
wherein the controller is configured to:
supply the voltage to the second resistive element;
measure current through the second resistive element;
determine resistance of the second resistive element based on the voltage supplied to the second resistive element and the current measured through the second resistive element;
determine a second temperature of the showerhead based on the resistance of the second resistive element;
compare the second temperature to the setpoint temperature; and
control the supply of power to the second resistive heater based on the comparison.

13. The system of claim 12 wherein the controller is configured to determine the temperature of the showerhead using a second lookup table generated by performing an in situ calibration of the second resistive element.

14. A system comprising:
a resistive heater configured to receive power to heat a showerhead of a plasma chamber;
a resistive element thermally bonded to the showerhead of the plasma chamber,
wherein the resistive element changes resistance in response to a change in temperature of the showerhead,
wherein the resistive element is encapsulated in an insulating material to electrically insulate the resistive element from the showerhead,
wherein the insulating material is a good conductor of heat, and
wherein the power to the resistive heater is received based on the resistance of the resistive element; and
a controller configured to:
supply the power to the resistive heater;
supply a voltage to the resistive element;
measure a current through the resistive element;
determine the resistance of the resistive element based on the voltage supplied to the resistive element and the current measured through the resistive element;
determine the temperature of the showerhead based on the resistance of the resistive element;
compare the temperature to a setpoint temperature for the showerhead; and control the supply of the power to the resistive heater based on the comparison to control the heating of the showerhead,
wherein the determination of the resistance of the resistive element is immune to a DC bias associated with the showerhead.

15. The system of claim 14 wherein the controller is configured to determine the temperature of the showerhead using a lookup table generated by performing an in situ calibration of the resistive element.

16. The system of claim 14 wherein the controller is configured to:
increase the power supplied to the resistive heater in response to the temperature of the showerhead being less than or equal to the setpoint temperature; and
decrease the power supplied to the resistive heater in response to the temperature of the showerhead being greater than or equal to the setpoint temperature.

17. The system of claim 14 wherein the DC bias is induced by plasma in the plasma chamber.

18. The system of claim 14 wherein the DC bias is applied to the showerhead to control flow of particles in the plasma chamber.

19. The system of claim 14 wherein the showerhead comprises a first electrode, the system further comprising:
a substrate support configured to support a substrate during processing, the substrate support comprising a second electrode;
an RF generator configured to generate RF power; and
a gas delivery system configured to supply process gas in the plasma chamber,
wherein the controller is further configured to apply the RF power across the first electrode and the second electrode in response to the process gas being supplied to strike plasma in the plasma chamber, and
wherein the determination of the resistance of the resistive element is unaffected by a DC bias induced by the plasma on the showerhead.

20. The system of claim 19 wherein:
the controller is configured to apply a DC bias to the showerhead to control flow of particles in the plasma chamber; and
the determination of the resistance of the resistive element is unaffected by the DC bias applied to the showerhead.

21. The system of claim 14 wherein the power supplied to the resistive heater includes AC power and wherein the voltage supplied to the resistive element includes DC voltage.

22. The system of claim 14 further comprising:
a second resistive element thermally bonded to the showerhead; and
wherein the controller is configured to:
supply the voltage to the second resistive element;
measure current through the second resistive element;
determine resistance of the second resistive element based on the voltage supplied to the second resistive element and the current measured through the second resistive element;
determine a second temperature of the showerhead based on the resistance of the second resistive element;
compare the second temperature to a predetermined temperature threshold; and
stop the supply of power to the resistive heater in response to the second temperature being greater than or equal to the predetermined temperature threshold to prevent the showerhead from overheating.

23. The system of claim 22 wherein the controller is configured to determine the temperature of the showerhead using a second lookup table generated by performing an in situ calibration of the second resistive element.

24. The system of claim 14 further comprising:
a second resistive element thermally bonded to the showerhead; and
wherein the controller is configured to:
supply the voltage to the second resistive element;
measure current through the second resistive element;
determine resistance of the second resistive element based on the voltage supplied to the second resistive element and the current measured through the second resistive element;
determine a second temperature of the showerhead based on the resistance of the second resistive element;
determine an average temperature of the showerhead based on the temperature and the second temperature;
compare the average temperature to the setpoint temperature; and
control the supply of power to the resistive heater based on the comparison.

25. The system of claim 14 further comprising:
a second resistive heater arranged in a different location than a location of the resistive heater in the showerhead to heat the showerhead;
a second resistive element thermally bonded to the showerhead proximate to the different location; and
wherein the controller is configured to:
supply the voltage to the second resistive element;
measure current through the second resistive element;
determine resistance of the second resistive element based on the voltage supplied to the second resistive element and the current measured through the second resistive element;
determine a second temperature of the showerhead based on the resistance of the second resistive element;
compare the second temperature to the setpoint temperature; and
control the supply of power to the second resistive heater based on the comparison.

* * * * *